(12) United States Patent
Dempsey

(10) Patent No.: US 7,395,466 B2
(45) Date of Patent: Jul. 1, 2008

(54) METHOD AND APPARATUS TO ADJUST VOLTAGE FOR STORAGE LOCATION RELIABILITY

(75) Inventor: Morgan J. Dempsey, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 11/322,518

(22) Filed: Dec. 30, 2005

(65) Prior Publication Data

US 2007/0165477 A1    Jul. 19, 2007

(51) Int. Cl.
*G11C 29/00* (2006.01)

(52) U.S. Cl. .............................. 714/721; 714/5; 714/14; 714/31; 714/42; 714/47; 714/54; 714/704; 714/706; 714/715; 714/718; 714/719; 714/723; 714/724; 714/733; 714/734; 702/60; 702/99; 365/185.27; 365/201; 365/211; 365/227; 365/228

(58) Field of Classification Search ....................... None
See application file for complete search history.

(56) References Cited

U.S. PATENT DOCUMENTS

| | | | | |
|---|---|---|---|---|
| 5,440,305 A | * | 8/1995 | Signore et al. .............. 341/120 |
| 5,644,271 A | * | 7/1997 | Mollov et al. ............... 331/176 |
| 5,675,546 A | * | 10/1997 | Leung ......................... 365/201 |
| 6,801,470 B2 | * | 10/2004 | Clark et al. .................. 365/226 |
| 6,804,141 B1 | * | 10/2004 | Rickes et al. ................ 365/145 |
| 7,237,074 B2 | * | 6/2007 | Guterman et al. ........... 711/156 |
| 7,239,557 B2 | * | 7/2007 | Ha ........................ 365/185.33 |
| 7,249,289 B2 | * | 7/2007 | Muranaka et al. ............. 714/48 |
| 2003/0021171 A1 | * | 1/2003 | Beigel et al. ................. 365/201 |
| 2005/0281112 A1 | * | 12/2005 | Ito et al. ...................... 365/222 |

OTHER PUBLICATIONS

Poellabauer et al., "Feedback-Based Dynamic Voltage and Frequency Scaling for Memory-Bound Real-Time Applications", IEEE 10.1109/RTAS.2005.23, Mar. 10, 2005, pp. 234-243.*

* cited by examiner

*Primary Examiner*—John P Trimmings
(74) *Attorney, Agent, or Firm*—Blakely, Sokoloff, Taylor & Zafman LLP

(57) ABSTRACT

According to embodiments of the present invention, an integrated circuit such as a processor includes a counter to count an actual number of unreliable storage locations in the processor cache, at least one register to store an acceptable number of unreliable storage locations for the cache, a detector to measure a thermal environment of the processor, and circuitry to raise an operating voltage of the processor if the actual number of unreliable storage locations exceeds the acceptable number of unreliable storage locations, and if the thermal environment is acceptable.

15 Claims, 5 Drawing Sheets

METHOD AND APPARATUS TO ADJUST VOLTAGE FOR STORAGE LOCATION RELIABILITY

BACKGROUND

1. Field

Embodiments of the present invention relate to integrated circuits and, in particular, to storage locations in integrated circuits.

2. Discussion of Related Art

In general, integrated circuit (IC) devices can be used to temporarily or permanently store information or data. For example, memory devices such as read-only memory (ROM) have storage locations that can be read. Memory devices such as random access memory (RAM) have storage locations that can be read and written.

Typically, the device is specified to work within a given environment and at a particular voltage. These specifications commonly represent a worst case environment in which the part will work properly. As technology takes the industry to smaller geometries and lower operating voltages, the integrity the devices may become an issue, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 4 is a simplified block diagram of the storage location reliability adjustment module depicted in FIG. 1 according to an embodiment of the present invention.

DETAILED DESCRIPTION OF EMBODIMENTS

Figure 1:
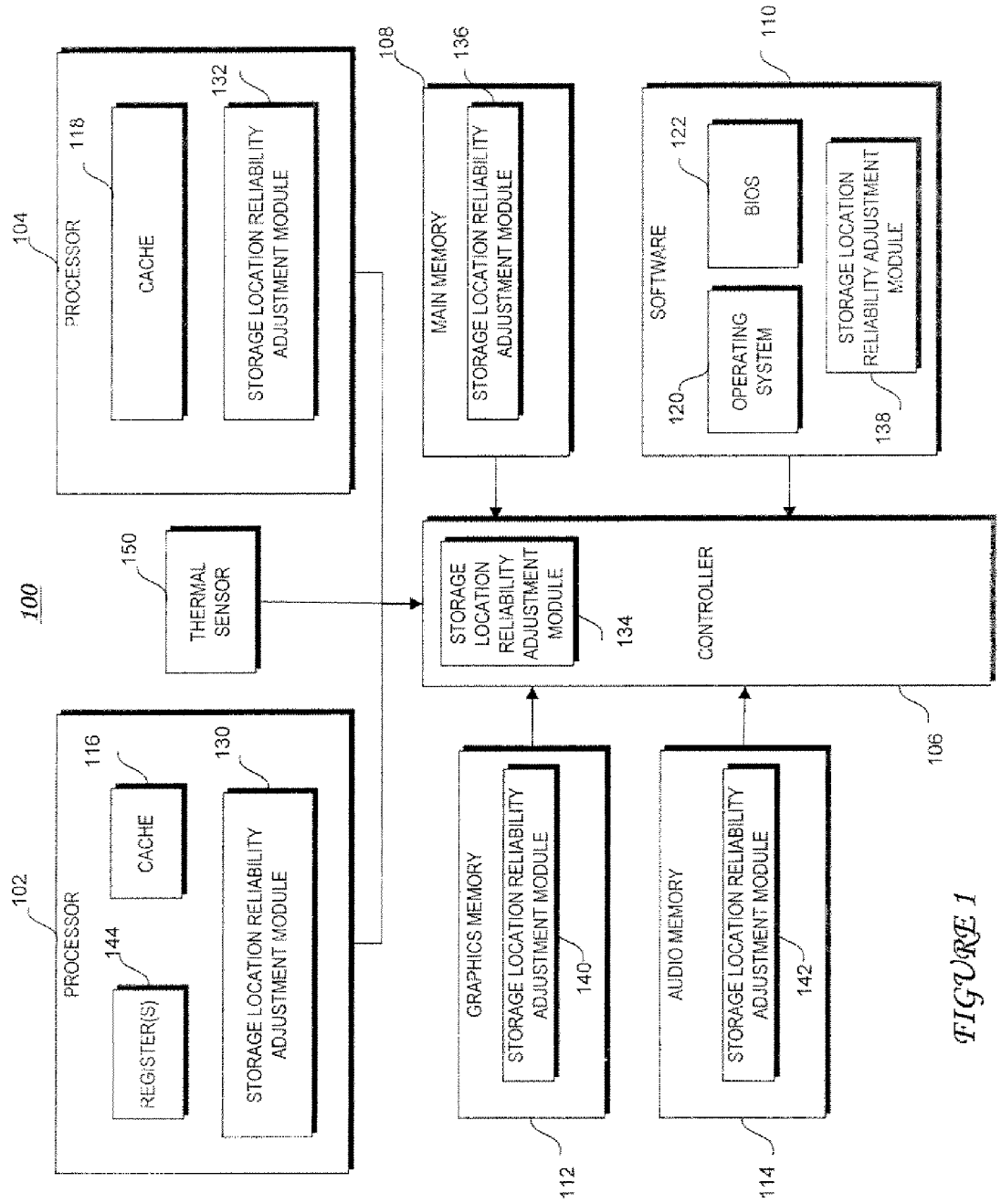
FIG. 1 is a simplified block diagram of a computer system according to an embodiment of the present invention.

FIG. 1 is a simplified block diagram of a computer system 100 according to an embodiment of the present invention. The computer system 100 in the illustrated embodiment includes two processors 102 and 104 coupled to a controller 106. Main memory 108, software 110, graphics memory 112 and audio memory 114 also are coupled to the controller 106.

The processors 102 and 104 in the illustrated embodiment include cache 116 and 118, respectively. The software 110 in the illustrated embodiment includes an operating system 120 and a basic input/output system (BIOS) 122.

The processors 102 and 104 in the illustrated embodiment include storage location reliability adjustment modules 130 and 132, respectively. The controller 106 in the illustrated embodiment includes a storage location reliability adjustment module 134. Main memory 108 in the illustrated embodiment includes a storage location reliability adjustment module 136. In the illustrated embodiment, the software 110 includes storage location reliability adjustment module 138. The graphics memory 112 and the audio memory 114 in the illustrated embodiment include storage location reliability adjustment modules 140 and 142, respectively. The processor 102 includes one or more registers 144.

A thermal sensor 150 may be coupled to the processors 102 and 104 and the controller 106.

The computer system 100 may be all or part of any logical device, processor, graphics device, network chip, memory chip, or other device. For example, the computer system may be part of a server, such as a processor-based server, for example. Alternatively, the computer system 100 may be part of a chipset, such as a desktop, laptop, or server chipset.

Although illustrated as processors, the device 102 and/or the processor 104 may be any logical device, processor, graphics device, network chip, memory chip, or other device. In embodiments in which the devices 102 and/or 104 are processors, they may perform their conventional functions of executing programming instructions, including implementing the teachings of the embodiments of the present invention. The processor 102 and/or 104 can be a processor of the Pentium® family available from Intel Corporation of Santa Clara, Calif.

In some embodiments, the controller 106 manages main memory 108, the graphics memory 112, and the audio memory 114 and performs conventional functions of controlling and monitoring the status of memory data lines, error checking, etc. In other embodiments, the controller 106 controls a redundant array of independent disks (RAID) drive.

Main memory 108 in some embodiments performs its conventional functions of storing data (pixels, frames, audio, video, etc.) and software (control logic, instructions, code, computer programs, etc.) for access by other computer system 100 components. In general, main memory 108 includes several data lines corresponding to several addressable storage locations. Suitable memory can be a random access memory (RAM).

Software 110, in general, may be control logic, instructions, commands, code, computer programs, etc., executed by the computer system 100 to perform functions described herein.

For some embodiments, the graphics memory 112 may be a small hardware buffer with memory storage locations. In another embodiment, the graphics memory 112 may be a frame buffer.

For some embodiments, the audio memory 114 also may be a hardware buffer with memory storage locations. In another embodiment, the audio memory 114 may be a frame buffer.

For some embodiments, the caches 116 and 118 may be ultra-fast storage locations that store recently accessed or frequently accessed data so that the processors 102 and 104, respectively, do not have to retrieve the data from the main memory 108. The caches 116 and 118 may be random access memory (RAM) devices.

The operating system 120 may perform its conventional functions of managing the allocation and de-allocation of resources within the computer system 100 during execution of programs. The operating system 120 may be stored in a ROM device.

The basic input/output system (BIOS) 122 may be a low-level interface set of instructions between application software and hardware. The BIOS 122 typically includes a set of functions that are performed when the software 110 invokes a specific routine. The BIOS 122 may be stored in a read only memory (ROM) device.

The registers 144 may be data registers, address registers, general purpose registers, floating point registers, instruction registers, or the like.

The computer system 100 may include several thermal sensors in the storage location reliability adjustment modules to measure temperature in the respective components. The thermal sensor 150 may determine the thermal environment of the computer system 100 overall, may measure the temperature within the chassis of the computer system, and/or may measure the temperature of the air coming into the computer system 100.

Figure 2:
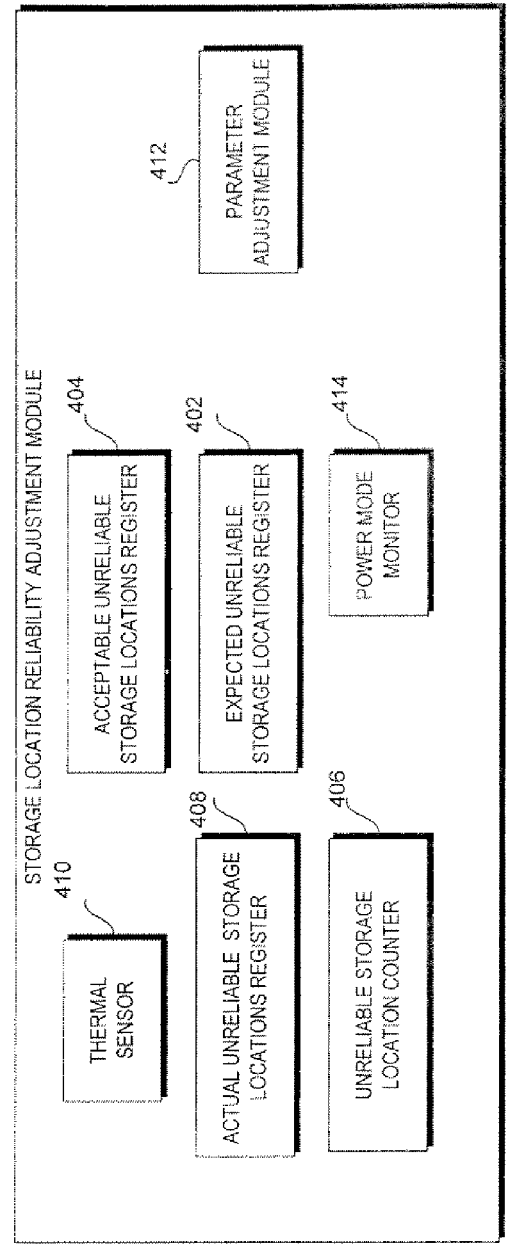
FIG. 2 is a diagram illustrating an array of storage locations that may be found in the computer system depicted in FIG. 1 according to an embodiment of the present invention.

FIG. 2 is a diagram illustrating an array 200 of storage locations that may be found in the computer system 100 according to an embodiment of the present invention. In the illustrated embodiment, the array 200 includes storage locations 202, 204, 206, 208, 210, 212, 214, 216, 218, 220, 222, 224, 226, 228, 230, and 232.

In one embodiment, the array 200 may be part of a cache such as the caches 116 and/or 118, for example. In another embodiment, the array 200 may be part of a memory such as the main memory 108, the graphics memory 112, and/or the audio memory 114, for example.

In some embodiments, one or more of the storage locations 202, 204, 206, 208, 210, 212, 214, 216, 218, 220, 222, 224, 226, 228, 230, and/or 232 in the array 200 may be a register such as the register 144, for example.

Figure 3:
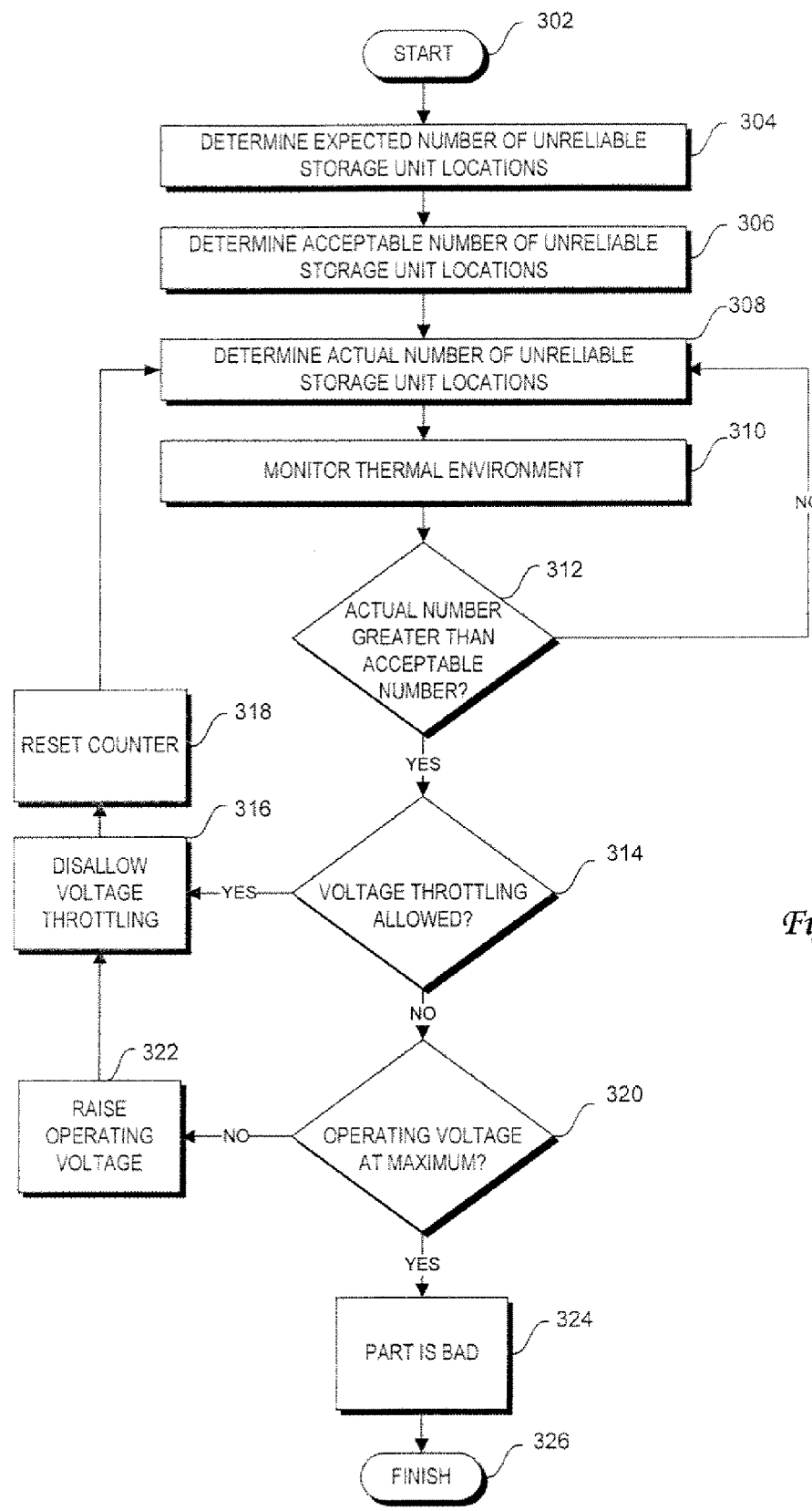
FIG. 3 is a flowchart illustrating a method for operating the computer system depicted in FIG. 1 according to an embodiment of the present invention.

FIG. 3 is a flowchart illustrating a process 300 for operating the computer system 100 according to an embodiment of the present invention in which the storage location reliability adjustment module 130 monitors the array 200 in the processor 102 to determine a number of unreliable storage locations and may raise or lower the operating voltage on the processor 102 as appropriate in an effort to reduce the number of unreliable storage locations in the processor 102.

The process 300 is described with reference to FIG. 4, which is a simplified block diagram of the storage location reliability adjustment module 130 according to an embodiment of the present invention. The illustrated embodiment includes a register 402 to store an expected number of unreliable storage locations for the processor 102, a register 404 to store an acceptable number of unreliable storage locations for the processor 102, a counter 406 to count an actual number of unreliable storage locations for the processor 102, a register 408 to store the actual number of unreliable storage locations for the processor 102, a thermal sensor 410 to monitor the thermal environment or temperature of the processor 102, parameter adjustment module 412 to adjust the operating voltage and/or operating frequency of the processor 102, and a power mode monitor 414 to monitor whether the processor 102 is in thermal throttling mode.

The process 300 begins with a block 302, where control passes to a block 304. In the block 304, an expected number of unreliable storage locations in the array 200 may be determined. For some embodiments, the Machine Check Architecture (MCA) subsystem (not shown) in the processor 102 may search and log faults in operation of the processor 102 logic. The expected number of unreliable storage locations may be predicted based on the detected faults. The expected number of unreliable storage locations in the array 200 may be stored in the register 202.

In a block 306, an acceptable number of unreliable storage locations in the array 200 may be determined. In one embodiment, the acceptable number of unreliable storage locations in the array 200 may be determined as a function of time. In an alternative embodiment, the acceptable number of unreliable storage locations in the array 200 may be determined based on the cumulative total number of unreliable storage locations in the array 200. In still another embodiment, the acceptable number of unreliable storage locations in the array 200 may be only one unreliable storage location per cache line in the cache 116 and that if there are two unreliable storage locations per cache line, then that is deemed an unacceptable number of unreliable storage locations. The acceptable number of unreliable storage locations in the array 200 may be stored in the register 204.

In a block 308, an actual number of unreliable storage locations in the array 200 may be determined. In one embodiment, the counter 206 may count the errors for each of the storage locations 202, 204, 206, 208, 210, 212, 214, 216, 218, 220, 222, 224, 226, 228, 230, and/or 232. If the number of errors and/or error rate for a storage location 202, 204, 206, 208, 210, 212, 214, 216, 218, 220, 222, 224, 226, 228, 230, and/or 232 is greater than a predetermined number or rate, then the storage location 202, 204, 206, 208, 210, 212, 214, 216, 218, 220, 222, 224, 226, 228, 230, and/or 232 may be deemed an unreliable storage location. In this case, the storage location 202, 204, 206, 208, 210, 212, 214, 216, 218, 220, 222, 224, 226, 228, 230, and/or 232 may be stored in the register 208.

In a block 310, the thermal environment of the cache 116 is monitored. In some embodiments, the thermal sensor 410 monitors the temperature of the processor 102.

In a block 312, it is determined whether the actual number of unreliable storage locations is greater than the acceptable number of storage locations. For some embodiments, the value of the acceptable number of unreliable storage locations stored in the register 204 may be compared to the value of the actual number of unreliable storage locations stored in the register 408.

If the actual number of unreliable storage locations is not greater than the acceptable number of storage locations, then the process 300 returns to the block 308 and the counter 206 may begin to re-count the errors for each of the storage locations 202, 204, 206, 208, 210, 212, 214, 216, 218, 220, 222, 224, 226, 228, 230, and/or 232.

If in the block 312 it is determined that the actual number of unreliable storage locations is greater than the acceptable number of unreliable storage locations, then in a block 314 it may be determined whether voltage throttling is allowed. If voltage throttling is allowed, then in a block 316 voltage throttling may be disabled, in a block 318, the parameter adjustment module 412 may reset the counter 206 to a predetermined value, and the process 300 returns to the block 308 in which a new actual number of unreliable storage locations in the array 200 may be determined.

In one embodiment, the counter 406 may be reset to zero and may count up to the acceptable number of unreliable storage locations. For other embodiments, the counter 406 may be reset to count down from the acceptable number of unreliable storage locations to zero. For still other embodiments, the counter 406 may be reset to count up or down between the acceptable number of unreliable storage locations to zero and some predetermined value.

If in the block 314 it is determined that voltage throttling is not allowed, then in a block 320 it is determined whether the processor 102 is operating at a predetermined voltage. In one embodiment, the predetermined voltage may be a maximum operating voltage for the processor 102.

If in the block 320 it is determined that the processor 102 is not operating at the predetermined voltage, then in a block 322 the parameter adjustment module 412 may raise the operating voltage of the processor 102, may disable voltage throttling in the block 316, the counter 406 may be reset in the block 318, and may begin re-counting the errors for each of the storage locations 202, 204, 206, 208, 210, 212, 214, 216, 218, 220, 222, 224, 226, 228, 230, and/or 232.

In alternative embodiments, the operating system 120 may raise the operating voltage of the processor 102. The parameter adjustment module 412 may be hardware, software, firmware, or a combination thereof, and may be assisted by the operating system (OS) 120.

If in the block 320 it is determined that the processor 102 is operating at the predetermined voltage, then in a block 324 it may be determined that the processor 102 is faulty. For some embodiments, the processor 102 may then be returned to the manufacturer.

In effect, without voltage throttling when the acceptable number of unreliable storage locations for the processor 102 is detected the operating voltage of the processor 102 may be raised and the counter 406 may be reset. Eventually, the processor 102 may stabilize at some number of unreliable storage locations that is less than the acceptable number of unreliable storage locations.

Alternatively, the processor 102 may reach the predetermined operating voltage. If the processor reaches the predetermined operating voltage and the actual number of unreliable storage locations is greater than or exceeds the acceptable number of unreliable storage locations for the processor 102, then the processor 102 is returned to the manufacturer. For some embodiments, the user of the processor 102 may be given an indication that the processor 102 should be returned.

In an alternative embodiment, the operating frequency of the processor 102 may be throttled (raised and/or lowered) to keep the processor 102 from overheating, for example. In embodiments in which raising the operating voltage may not be appropriate, the parameter adjustment module 412 may lower the operating frequency of the processor 102.

With either voltage throttling and/or frequency throttling, the processor 102 may go into one or more low voltage states. The lower voltage states may increase the actual number of unreliable storage locations counted by the counter 406 for the processor 102. Thus, the process 300 disables voltage throttling in the block 316, resets the counter 406 in the block 318, and begins re-counting the number of unreliable storage locations for the processor 102.

The process finishes in a block 326.

In some embodiments, the predetermined voltage may be a fixed value. In other embodiments, the predetermined value may be a function of the thermal environment. For example, the predetermined value may be a function of whether the processor is in a worst case environment or a much more forgiving environment. The thermal environment assessment may be made using the lowest temperature the processor 102 has experienced, the highest temperature the processor 102 has experienced, the time the processor 102 has been in operation, the peak workload percentage for the processor, the chassis temperature for the computer system 100 (as determined by the thermal sensor 150, for example), the temperature of incoming air (as determined by the thermal sensor 150, for example), and the like, and by statistically mapping the thermal environment. Thus, in one embodiment, if the incoming air is 25 C, it could be assumed that the processor 102 is in an air conditioned room, which may be a thermally forgiving environment.

Figure 5:
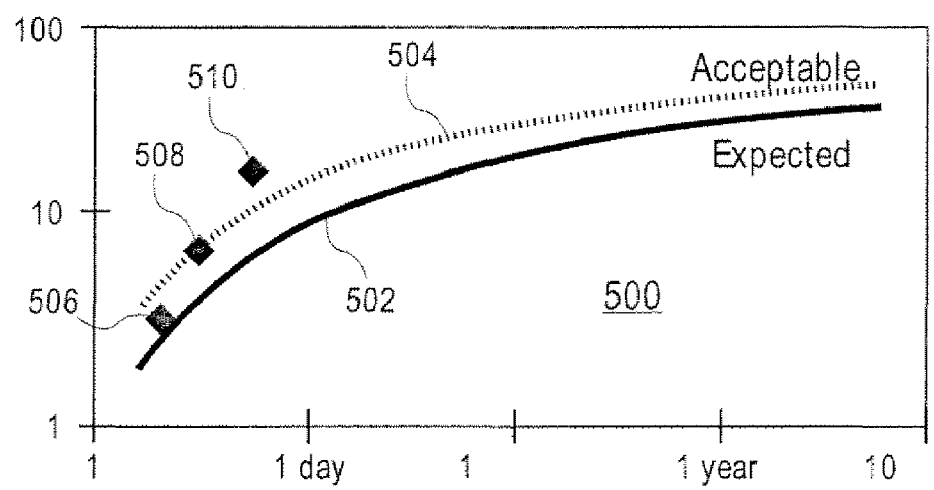
FIG. 5 is a graphical representation illustrating a relationship among an expected number of unreliable storage locations for a device, an FIG. 6 is a flowchart illustrating a method for operating the computer system depicted in FIG. 1 according to an alternative embodiment of the present invention; acceptable number of unreliable storage locations for the device, and an actual number of unreliable storage locations for the device according to an embodiment of the present invention.

FIG. 5 is a graphical representation 500 illustrating a relationship among an expected number of unreliable storage locations for a device, such as the processor 102 and/or the memory 108, an acceptable number of unreliable storage locations for the device, and an actual number of unreliable storage locations for the device according to an embodiment of the present invention. The curve 502 represents the expected number of unreliable storage locations for the device. The curve 504 represents the acceptable number of unreliable storage locations for the device.

The points 506, 508, and 510 represent a total count for the actual number of unreliable storage locations for the device over time. When the total count for the actual number of unreliable storage locations for the device is at the point 510, the device's storage location reliability adjustment module should be attempting to either lower the operating voltage of the device or lower the operating frequency of the device, depending on the power mode of the device.

Figure 6:
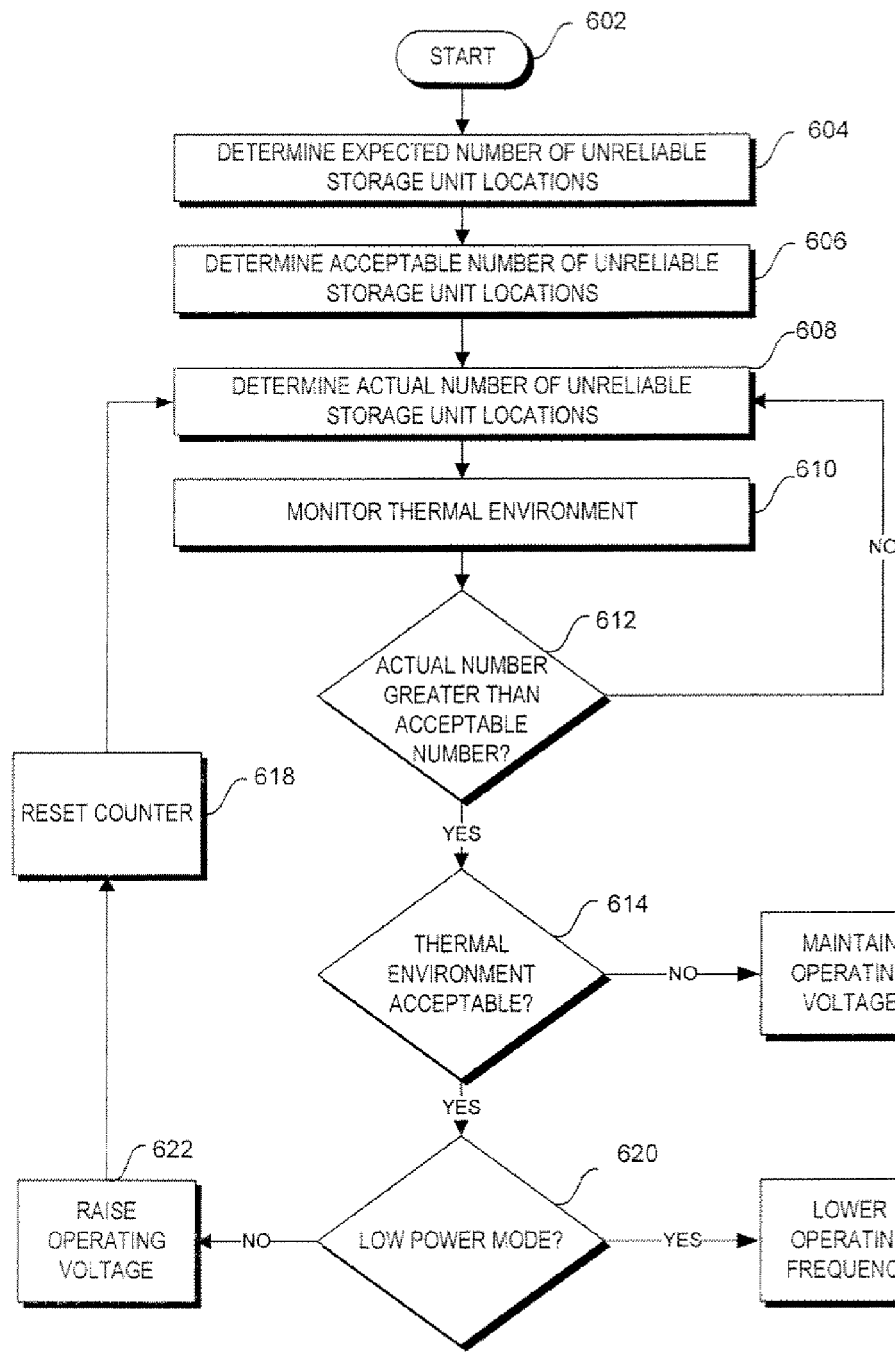

FIG. 6 is a flowchart 600 illustrating a method for operating the computer system 100 according to an alternative embodiment of the present invention. The flowchart 600 operates similarly to the flowchart 300 as indicated in blocks 602, 604, 606, 608, 610, and 612. Blocks 614, 616, 618, 620, 622, and 624 illustrate that under certain conditions, the operating voltage may be raised or maintained, or the operating frequency may be lowered.

Although embodiments of the present invention have been described with respect to the array 200 as implemented for storage locations in the cache 116 and/or register 144 in the processor 102, embodiments are not so limited. For example, the storage location reliability adjustment modules 132, 134, 136, 138, 140, and 142 may operate similarly to the storage location reliability adjustment module 130 in the processor 102.

The operations of the process 300 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the process 300 is an example method and other methods may be used to implement embodiments of the present invention.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the methods described herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
    determining an actual number of unreliable storage locations for an integrated circuit;
    determining an acceptable number of unreliable storage locations for the integrated circuit;
    if the actual number of unreliable storage locations exceeds the acceptable number of unreliable storage locations, then raising an operating voltage of the integrated circuit; and
    if the actual number of unreliable storage locations exceeds the acceptable number of unreliable storage locations, then determining whether throttling of an operating voltage of the integrated circuit is enabled.

2. The method of claim 1, further comprising if throttling of the operating voltage of the integrated circuit is enabled, then:
    disabling throttling of the operating voltage of the integrated circuit;
    resetting a counter that counts the actual number of unreliable storage locations to a predetermined count value; and
    re-determining the actual number of unreliable storage locations.

3. The method of claim 1, further comprising if throttling of the operating voltage of the integrated circuit is enabled, then determining whether the operating voltage of the integrated circuit is at a predetermined voltage.

4. The method of claim 1, further comprising if the operating voltage of the integrated circuit is not at a predetermined voltage, then:
    raising the operating voltage of the integrated circuit;
    disabling throttling of the operating voltage of the integrated circuit;
    resetting a counter that counts the actual number of unreliable storage locations to a predetermined count value; and
    re-determining the actual number of unreliable storage locations.

5. The method of claim 1, further comprising if the operating voltage of the integrated circuit is at a predetermined voltage, then indicating to a user that the integrated circuit is faulty.

6. The method of claim 1, further comprising:
    determining that there are two unreliable storage locations per cache line; and
    if a thermal environment is acceptable, then raising the operating voltage of the integrated circuit.

7. An integrated circuit, comprising:
    a counter to count an actual number of unreliable storage locations for the integrated circuit;
    at least one register to store an acceptable number of unreliable storage locations for the integrated circuit; and
    circuitry to raise an operating voltage of the integrated circuit if the actual number of unreliable storage locations exceeds the acceptable number of unreliable storage locations.

8. The integrated circuit of claim 7, wherein the integrated circuit is selected from a group comprising a microprocessor, multiprocessor, microcomputer, central processing unit, graphics device, network chip, or memory chip.

9. The integrated circuit of claim 8, wherein the actual number of unreliable storage locations comprises at least one storage location in a register and wherein the acceptable number of unreliable storage locations comprises at least one storage location in the register.

10. The integrated circuit of claim 8, wherein the actual number of unreliable storage locations comprises at least one storage location in a cache line, and wherein the acceptable number of unreliable storage locations comprises at least one storage location in the cache line.

11. The integrated circuit of claim 7, wherein the circuitry is further configured to determine whether throttling of the operating voltage of the integrated circuit is enabled.

12. The integrated circuit of claim 11, wherein if throttling of the operating voltage of the integrated circuit is enabled, then the circuitry is further configured to:
    disable throttling of the operating voltage of the integrated circuit;
    reset the counter to a predetermined count value; and
    wherein the counter is to re-count the actual number of unreliable storage locations.

13. The integrated circuit of claim 12, wherein if throttling of the operating voltage of the integrated circuit is not enabled, then the circuitry is further configured to determine whether the operating voltage of the integrated circuit is at a predetermined voltage.

14. The integrated circuit of claim 13, wherein if the operating voltage of the integrated circuit is not at a predetermined voltage, then the circuitry is further configured to:
    raise the operating voltage of the integrated circuit;
    disable throttling of the operating voltage of the integrated circuit;
    reset the counter to a predetermined count value; and
    wherein the counter is to re-count the actual number of unreliable storage locations.

15. The integrated circuit of claim 13, wherein if the operating voltage of the integrated circuit is at a predetermined voltage, then the circuitry is further configured to indicate that the integrated circuit is faulty.

* * * * *